US006339701B1

(12) United States Patent
Myer et al.

(10) Patent No.: US 6,339,701 B1
(45) Date of Patent: Jan. 15, 2002

(54) METHOD AND APPARATUS FOR EXTENDING THE DYNAMIC RANGE OF A FREQUENCY MIXER

(75) Inventors: Robert Evan Myer, Denville; Mohan Patel, Edison; Jack Chi-Chieh Wen, Township of Parsippany, Morris County, all of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/098,652

(22) Filed: Jun. 17, 1998

(51) Int. Cl.[7] .................................................. H04G 1/04
(52) U.S. Cl. ........................ 455/112; 455/117; 455/118; 455/308; 455/313
(58) Field of Search .................................. 455/308, 313, 455/323, 303, 324, 117, 118, 112; 330/149

(56) References Cited

U.S. PATENT DOCUMENTS

| 4,408,352 A | 10/1983 | Dudding | 455/295 |
| 4,580,105 A | 4/1986 | Myer | 330/149 |

(List continued on next page.)

FOREIGN PATENT DOCUMENTS

| GB | 1495264 A | 2/1974 | H03F/1/32 |
| GB | 2296615 A | 7/1996 | H03F/1/32 |
| GB | 2318938 A | 5/1997 | H03F/1/32 |

OTHER PUBLICATIONS

"Expanding Bit Resolution Of An A to D Converter, Dec. 1967." IBM Technical Disclosure Bulletin, vol. 10, No. 7, pp. 919–920, XP002116707, New York, US.
Patent Abstracts of Japan, vol. 015, No. 269 (E1087), Jul. 9, 1991 & JP03089627A (Teac Corp), Apr. 15, 1991.
Seifert, E. et al.: "Enhancing The Dynamic Range Of Analog–To–Digital Converters By Reducing Excess Noise," proceedings of the Pacific Rim Conference on Communications, Computers & Signal Processing, Victoria, Jun. 1–2, 1989, pp. 574–576, Institute of Electrical & Electronics Engineers.

*Primary Examiner*—Dwayne Bost
*Assistant Examiner*—Temica M. Davis

(57) ABSTRACT

A frequency mixing system that provides an expanded dynamic range when compared to the dynamic range(s) of an individual mixer(s) that makes up the frequency mixing system. The frequency mixing system adjusts the amplitude of an input signal to be frequency mixed to produce a frequency converted signal with an acceptable and/or lower (when compared to the amplitude of intermodulation distortion produced by mixing the input signal without amplitude adjustment) amplitude of intermodulation distortion. If the input signal were frequency mixed without the amplitude adjustment, an unacceptable and/or higher level of intermodulation distortion would result (when compared to the corresponding intermodulation distortion if the amplitude-adjusted signal were mixed by an individual mixer). Adjusting the amplitude of the input signal creates an adjusted signal with signal distortion on the first path. The frequency mixing system uses a feed-forward arrangement to reduce the signal distortion created by adjusting the amplitude of the input signal, thereby producing the desired frequency converted signal with the lower and/or acceptable level of intermodulation distortion. For example, the signal distortion from the first path can be placed on a second path, frequency converted using a second mixer on the second path, and subsequently put back into the first path to combine with the signal distortion on the first path to provide the desired frequency converted signal with the acceptable and/or lower level of intermodulation distortion. By increasing the relative difference between the amplitudes of the desired frequency converted signal and of the intermodulation distortion, the frequency mixing system provides an expanded dynamic range.

14 Claims, 1 Drawing Sheet

U.S. PATENT DOCUMENTS

| | | | |
|---|---|---|---|
| 4,583,049 A | 4/1986 | Powell | 330/151 |
| 4,665,560 A | 5/1987 | Lange | 455/249 |
| 4,876,741 A * | 10/1989 | Jacobs et al. | 455/47 |
| 4,885,551 A | 12/1989 | Myer | 330/52 |
| 4,926,136 A | 5/1990 | Olver | 330/149 |
| 5,012,490 A | 4/1991 | Myer | 375/58 |
| 5,304,945 A | 4/1994 | Myer | 330/149 |
| 5,430,893 A | 7/1995 | Myer | 455/209 |
| 5,619,168 A | 4/1997 | Myer | 330/149 |
| 5,847,603 A | 12/1998 | Myer | 330/52 |
| 5,912,586 A * | 6/1999 | Mitzlaff | 330/149 |
| 5,923,214 A * | 7/1999 | Mitzlaff | 330/52 |

* cited by examiner

METHOD AND APPARATUS FOR EXTENDING THE DYNAMIC RANGE OF A FREQUENCY MIXER

BACKGROUND OF THE INVENTION

1. Field of the Invention

This invention relates to frequency mixing of signals and, more particularly, to a frequency mixer with an extended dynamic range which can be used for the frequency upconversion and/or downconversion of signals.

2. Description of Related Art

Frequency conversion of signals is primarily accomplished by a frequency mixer element. The frequency mixer multiplies two or more input signals in the time domain or convolves one or more input signals in the frequency domain. For example, for certain frequency conversion applications, the frequency mixer mixes an input signal having a frequency f1 and a local oscillator signal having a frequency f2. By mixing these signals, the mixer produces first order frequency converted signal components having the frequencies f1+f2 and |f1−f2| with the amplitude or shape characteristics of the input signal. If frequency upconversion is desired, the lower frequency signal component is filtered out to leave an upconverted signal, and if frequency downconversion is desired, the higher frequency signal component is filtered out to leave a downconverted signal.

The mixing of the input signal and the local oscillator signal, however, also generates intermodulation distortion. In general, intermodulation distortion results from spurious combination frequency components in the output of a nonlinear element when two or more sinusoidal signals form the input. Intermodulation distortion of a complex wave (having multiple frequency components) arises from intermodulation of the components in the complex wave by each other in a nonlinear system, producing waves having frequencies, among others, equal to the sums and differences of the components of the original wave. The power level of the intermodulation distortion generated by a mixer depends upon the input signal power level. Typically, for an increase in input signal power level, the mixer generates a corresponding increase in output signal power level with an even greater increase in the power level of the intermodulation distortion. As such, the highest acceptable power level of intermodulation distortion resulting from the corresponding highest output signal power level generally defines a boundary for the dynamic range of the mixer. The dynamic range of the mixer can be defined for a given output power level as the difference between the output signal power level and the corresponding power level of the intermodulation distortion. Whether the dynamic range is acceptable depends on the particular application. If a given output signal power level exceeds the dynamic range of the mixer, this usually means that an unacceptable power level of intermodulation distortion is generated by the mixer along with the frequency mixed or converted output signal. Extending the dynamic range allows the mixer to produce a greater range of output signal power levels without generating unacceptable levels of intermodulation distortion. For example, in an application where a mixer is operating in a 30 kHz bandwidth, a mixer can have a dynamic range of 100 dB defined by a high output signal amplitude of 0 dBm and a corresponding intermodulation distortion amplitude of −100 dBm. Extending the dynamic range of the mixer occurs by increasing the relative difference between the amplitudes of the output signal and the intermodulation distortion.

A frequency mixer with an extended dynamic range is desirable.

SUMMARY OF THE INVENTION

The present invention involves a frequency mixing system that provides an expanded dynamic range when compared to the dynamic range(s) of an individual mixer(s) that makes up the frequency mixing system. The frequency mixing system adjusts the amplitude of an input signal to be frequency mixed to produce a frequency converted signal with an acceptable and/or lower (when compared to the amplitude of intermodulation distortion produced by mixing the input signal without amplitude adjustment) amplitude of intermodulation distortion. If the input signal were frequency mixed without the amplitude adjustment, an unacceptable and/or higher level of intermodulation distortion would result (when compared to the corresponding intermodulation distortion if the amplitude-adjusted signal were mixed by an individual mixer). Adjusting the amplitude of the input signal creates an adjusted signal with signal distortion on the first path. The frequency mixing system uses a feed-forward arrangement to reduce the signal distortion created by adjusting the amplitude of the input signal, thereby producing the desired frequency converted signal with the lower and/or acceptable level of intermodulation distortion. For example, the signal distortion from the first path can be placed on a second path, frequency converted using a second mixer on the second path, and subsequently put back into the first path to combine with the signal distortion on the first path to provide the desired frequency converted signal with the acceptable and/or lower level of intermodulation distortion. By increasing the relative difference between the amplitudes of the desired frequency converted signal and of the intermodulation distortion, the frequency mixing system provides an expanded dynamic range.

In certain embodiments, a limiting device on the first path limits the amplitude of the signal on the first path, thereby producing signal distortion emanating from the limiting device with the signal. The signal on the first path is then frequency mixed along with the signal distortion by a first mixer. The mixing of the signal generates an acceptable and/or lower level of intermodulation distortion because the input signal on the first path is amplitude adjusted or "clipped" to produce a converted signal within the dynamic range for the first mixer whereas the input signal without amplitude adjustment would have produced a converted signal outside the dynamic range of the first mixer. To remove the signal distortion from the first path caused by adjusting the amplitude of the signal on the first path, the signal distortion on the first path is isolated on the second path. To isolate the signal distortion on the second path, the signal on the first path along with the signal distortion is coupled onto the second path. The signal coupled from the first path is designed to be about 180 degrees out of phase with the signal on the second path. The signal from the first path combines with the signal on the second path, producing the signal distortion created by adjusting the amplitude of the input signal on the second path. The signal distortion on the second path is then frequency converted by a second mixer. The frequency converted distortion on the second path is coupled to the output of the first path to combine with the frequency converted distortion on the first path, thereby producing the desired frequency converted signal with the acceptable and/or lower level of intermodulation distortion.

BRIEF DESCRIPTION OF THE DRAWINGS

Other aspects and advantages of the present invention may become apparent upon reading the following detailed description and upon reference to the drawing in which.

DETAILED DESCRIPTION

Figure 1:
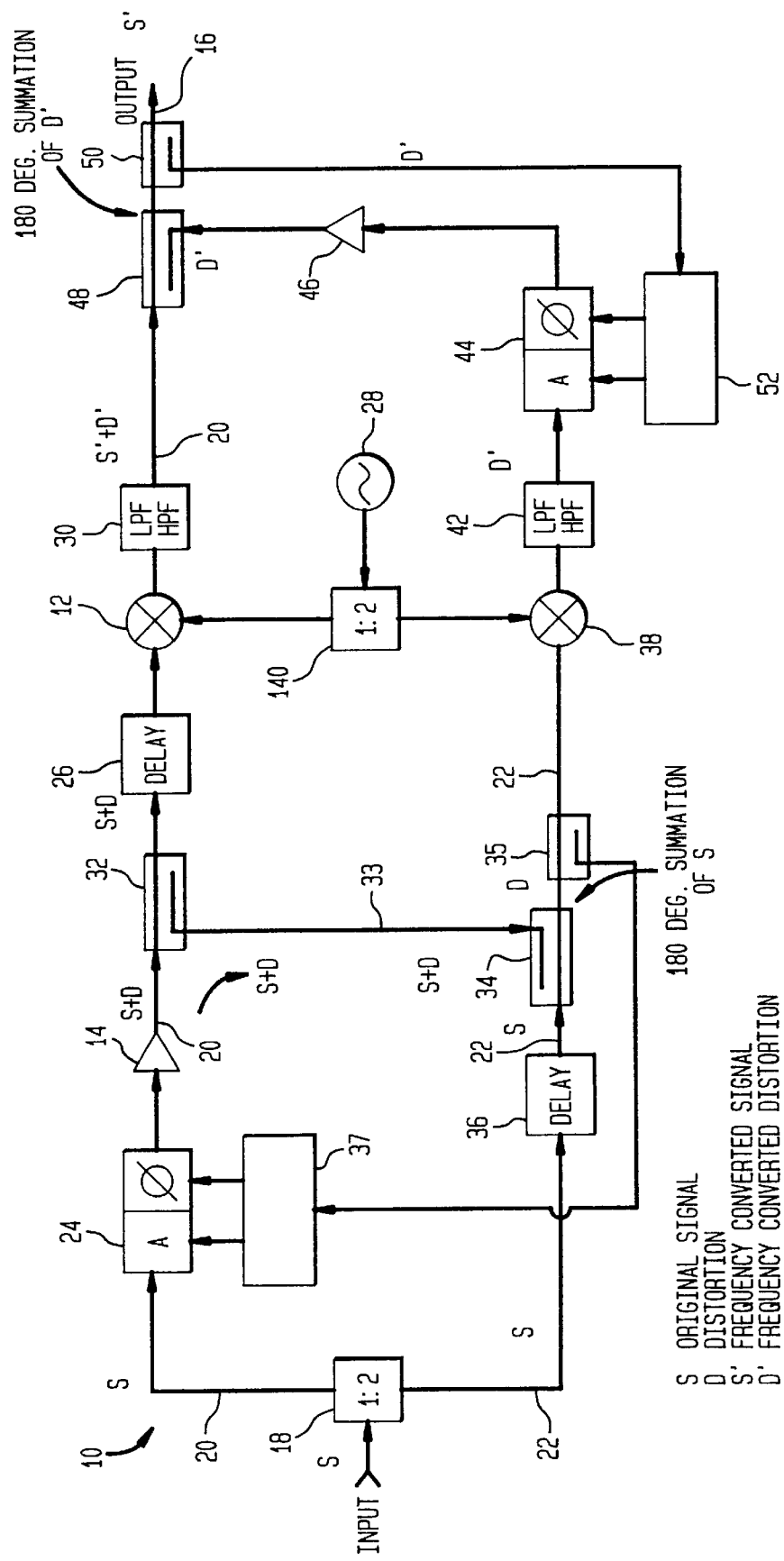
FIG. 1 shows a general block diagram of an embodiment of the frequency mixer with extended dynamic range according to the principles of the present invention.

An illustrative embodiment of the frequency mixer system with expanded dynamic range according to the principles of the present invention is described below. With particular reference to FIG. 1, a frequency mixer system 10 receives a signal S which is to be frequency converted or mixed. In this instance, the signal S has an amplitude which would create a frequency converted signal outside the dynamic range of a first mixer 12 in that the mixing of the signal S by the first mixer would generate an unacceptable power level of intermodulation distortion when compared to the frequency converted signal power level. The acceptable power level of intermodulation distortion when compared to the power level of the output signal is a design choice depending on the particular application. Typically, the dynamic range of the mixer is chosen for the particular application. In general, the dynamic range of the mixer is defined for a given output power level as the difference between the output signal power level and the resulting power level of intermodulation distortion. A boundary for an acceptable dynamic range is generally established by the difference between the highest power level of the output signal that corresponds to an acceptable power level for the intermodulation distortion. The highest acceptable power level of the intermodulation distortion generally determines the dynamic range because the power level of the intermodulation distortion generally increases more with increasing input signal power than the increase in output signal power, especially at the upper boundary of the dynamic range. For example, if the output signal rises by 1 dB, the mixer 12 typically generates 3 dB more of intermodulation distortion. As such, for discussion purposes, an acceptable dynamic range can be defined in terms of the highest output signal power level with an acceptable power level of intermodulation distortion.

Some definitions for dynamic range focus on the relative difference between the output signal level and the corresponding level of intermodulation distortion for a given range of input signals. Accordingly, extending the dynamic range results if 1) for a given output signal power level, the power level of the intermodulation distortion generated is reduced, 2) for a given power level of intermodulation distortion, the output signal power level is increased or 3) the relative difference increases between the output signal power level and the corresponding intermodulation distortion. As such, if for a given amplitude of intermodulation distortion, the resulting output signal amplitude can be increased without raising the amplitude of the intermodulation distortion, the dynamic range of the mixer is increased.

According to the principles of the present invention, a limiting device 14 adjusts the amplitude of the input signal S prior to the first mixer 12, thereby generating the resulting output composite signal S with signal distortion D due to the amplitude-limiting of the input signal S. The first mixer 12 mixes the composite signal S and D to produce a frequency converted signal S' and frequency converted signal distortion D' with an acceptable and/or lower (when compared to the resulting intermodulation distortion if the original signal S is mixed by the first mixer 12 without amplitude adjustment) level of intermodulation distortion. The input signal S could be an intermediate frequency (IF) transmitter signal (which will be typically upconverted to radio frequency), or a radio frequency (RF) receiver signal (which is typically downconverted to IF). The input signal S could also be a baseband signal being upconverted to IF in the transmitter, or an IF signal being downconverted to baseband in the receiver. By clipping the input signal, the limiting device 14 effectively takes the energy clipped from the input signal and relocates the energy in the form of signal distortion D. In this particular embodiment, the first mixer 12 mixes the composite signal S and D with a continuous wave signal. In other mixing applications, the composite signal S and D can be mixed with other types of signals. The mixer 12 produces a frequency converted signal S' along with the frequency converted signal distortion D' having the desired frequency. In this particular embodiment, the signal distortion D generated from the limiting device 14 is used to produce a second frequency converted signal distortion D'. The second frequency converted signal distortion D' is fed forward to combine with the frequency converted signal distortion D' at an output 16 of the frequency mixer 10, thereby producing the desired frequency converted signal S' with an acceptable and/or lower level of intermodulation distortion.

By feeding forward the frequency converted distortion energy D', the mixer system 10 is effectively reconstructing the desired frequency converted signal S' using the distortion energy D which was clipped from the signal S prior to mixing. By reconstructing the desired frequency converted signal S', the mixer 10 produces the desired frequency signal S' at an output level which is outside the dynamic range of the first mixer 12. The cancellation of the frequency converted distortion D' from the output 16 of the mixer 10 effectively adds frequency converted energy which was clipped from the input signal S by the limiting device 14 back into the frequency mixing path 20 to produce the desired frequency converted signal S'. In other words, when the signal S is clipped by the limiting device 14, the clipped energy shows up as signal distortion D. By isolating the signal distortion D on the second path 22, frequency mixing the signals on the paths 20 and 22 in parallel, and adding the distortion D' back into the frequency mixing path 20, the frequency converted signal S' is being reconstructed in the time domain. Since the frequency mixer 10 produces the desired frequency converted signal S' at an increased output power level, which would be outside the dynamic range of the first mixer 12, and with the acceptable and/or lower level of intermodulation distortion, the frequency mixer 10 provides an overall extended dynamic range. For example, if the dynamic range of the first mixer is 60 dB with a high output signal amplitude of 0 dBm and a corresponding intermodulation distortion level of −60 dBm, the dynamic range of the mixer system could be theoretically extended by 100% to 120 dB if the intermodulation distortion level is reduced to −120 dBm. The frequency mixing system will more likely achieve a dynamic range increase of 20 dB by increasing the relative difference between the high output signal level and the corresponding intermodulation distortion level.

In the embodiment illustrated in FIG. 1, the extended dynamic range frequency mixer 10 according to the principles of the present invention receives the signal S. The signal S is split by a 1:2 splitter 18 onto a frequency mixing path 20 and a second path 22. On the frequency mixing path 20 in this particular embodiment, a gain and phase adjuster 24 adjusts the phase and amplitude of the version of the signal S on the frequency mixing path 20. The phase and amplitude are adjusted to provide improved cancellation of the signal S on the second path 22 using the signal S on the frequency mixing path 20. The adjustments can be set, calculated or found in a look-up table based on measurements of the signal S, such as the power level of the signal S on the second path 22 after the combining of the signals S. In some applications, the phase and amplitude adjustments could be based on measurements of the signal S prior to the adjuster 24.

The limiting device 14 produces an output with an amplitude proportional to the input for output signal levels below or at the clipping or adjustment amplitude of the limiting device 14. The amplitude adjustment for the limiting device 14 can be designed to correspond to an upper amplitude or below the upper amplitude of inputs to the mixer 12 which produce outputs within the dynamic range established for the first mixer 12. For outputs from the limiting device 14 which would correspond to output amplitudes from the mixer 12 outside the dynamic range of the mixer 12, the limiting device 14 produces an output at the adjustment amplitude. The limiting device 14 can include an amplifier, diode arrangement, or any other limiting device. The result of the limiting action causes signal distortion D that emanates out of the limiting device 14 with the signal S.

The composite signal S and D on the frequency mixing path 20 is delayed by a delay 26 for equalizing the delay experienced by the composite signal S and D on the frequency mixing path 20 with the delay experienced by the signal distortion on the second path 22 as discussed below. Depending on the application, the delay 26 need not provide an exact equalization of the two delays, but sufficient delay equalization is required such that the corresponding portions of the signal distortions D' on the frequency mixing path 20 and the signal distortion D' on the second path 22 can be combined at about 180 degrees out of phase at the output 16. For example, the delay difference between the distortions can be on the order of picoseconds. Ideally, the signal distortion D' on the frequency conversion path 20 and the signal distortion D' on the second path 22 are combined at about 180 degrees out of phase, but depending on the application, the signal distortions D' can be more or less than 180 degrees out of phase, for example a 175–185 degree phase difference between the signal distortions D'.

In this particular embodiment, the signal S and the signal distortion D are provided to the mixer 12 and mixed with a continuous wave signal generated from the oscillator 28. In other applications, the signal(s) on the different paths 20 and 22 can be mixed with different signals and/or signals having a varying frequency, multiple frequencies, and/or a modulated signal or pseudo-random noise signal. In this application, the mixer 12 frequency converts the signal S and the signal distortion D to a desired frequency by mixing S and D with the continuous wave signal having the local oscillator frequency from an oscillator 28. The mixing produces frequency converted signal S' and frequency converted distortion D' having the desired frequency and retaining the amplitude characteristics of the composite signal S and D. The mixing also produces other undesired frequency-combination signals which can be filtered out. Because the signal S on the frequency mixing path 20 was adjusted so that the resulting frequency converted signal S' was within the dynamic range of the mixer 12, the mixing generates acceptable levels of intermodulation distortion. The output of the mixer 12 then passes through a filter 30 to remove the other undesired frequency signals resulting from the mixing, leaving the frequency converted signal S', the frequency converted distortion D' and an acceptable level of intermodulation distortion. The filter 30 is a low pass filter (LPF) for frequency downconversion and a high pass filter (HPF) for frequency upconversion.

The desired frequency converted signal S' is obtained at the output 16 of the frequency mixing system 10 by adding the frequency converted signal distortion D' on the second path 22 back into the frequency conversion path 20 after mixing. To do so, the signal distortion D is isolated on the second path 22. In this particular embodiment, a coupler 32 couples the composite signal S and D from the frequency mixing path 20 to a coupling path 33, and a coupler 34 couples the composite signal S and D onto the second path 22. The signal S is amplitude and phase adjusted by the adjuster 24 as well as by the other components to be about 180 degrees out of phase with the signal S already on the second path 22 to reduce the signal S from the second path 22. Depending on the application, the phase difference between the signals S need not be exactly 180 degrees, and the amplitudes of the two signals S on the paths 20 and 22 need not be equal. As mentioned above, depending on the application, sufficient cancellation of the signal S from the second path 22 can be achieved with a phase difference of about 175–185 degrees and an amplitude difference of about 2 dB. The signal S coupled from the frequency mixing path 20 combines with the signal S on the second path 22, leaving the signal distortion D coupled from the frequency conversion path 20 as the prominent signal relative to the signal S on the second path 22.

In certain embodiments, a coupler 35 provides a portion of the output of the coupler 34 to control circuitry 37. The control circuitry 37 provides phase and amplitude adjustment signals to the phase and amplitude adjusters 24 to improve the cancellation of the signal S from the second path 22 at the coupler 34. In any event, the adjuster 24, limiting device 14 and the couplers 32 and 34 are designed to make the signal distortion D the prominent signal on the second path 22. This can be accomplished with or without the coupler 35 and control circuitry 37 depending on the desired application.

On the second path 22, a delay 36 equalizes the delay difference between the distortion path 20 and the frequency mixing path 20 to the coupler 34 caused primarily by the gain and phase adjuster 24 and the limiting device 14 in this embodiment. Depending on the application, the delay 36 need not provide an exact equalization of the two delays, sufficient delay is required such that the corresponding portions of the signal S on the frequency mixing path 20 and the signal S already on the second path 22 can be combined in a manner that produces the signal distortion D on the second path 22. A delay difference on the order of picoseconds can be acceptable. As such, the signal S on the second path 22 is reduced at the output of the coupler 34, producing the signal distortion D as the prominent signal on the second path 22 relative to the signal S.

The couplers 32 and 34 are used as splitting and summing elements, respectively. In this particular embodiment, the couplers 32 and 34 produce less loss on the main path (the frequency mixing path 20 and the second path 22 respectively) than the 3 dB of loss that would be produced by conventional 3 dB summers or splitters which produce 3 dB of loss on both legs of the split or summation. In this particular embodiment, the couplers 32 and 34 produce low loss (for example, 0.5 dB respectively) on the frequency conversion path 20 and the second path 22, respectively (which provides a reduced noise figure). The couplers 32 and 34 attenuate (for example, 10–20 dB respectively) the composite signal S and D coupled onto the coupling path 33 and summed into the second path 22.

The signal distortion D on the second path 22 is then frequency converted using a second mixer 38 and the local oscillator signal from the oscillator 28. In this particular embodiment, a 1:2 splitter 40 is coupled to the oscillator 28 and provides the same local oscillator signals to both the first mixer 12 and the second mixer 38. Providing the same local oscillator signal to the first and second mixers 12 and 38 is done to reduce any small variations which could be introduced in the parallel mixing and detrimentally effect the combining of the signals at the coupler 48. Along those lines, the first and second mixers 12 and 38 could be the same types of mixer, but depending on the application, different types of mixers can be used which receive signals from different sources. In this particular embodiment, the output of the mixer 38 then passes through a filter 42 to remove undesired frequencies emanating from the mixer 38, such as undesired combination frequency components, leaving the frequency converted distortion D' as the prominent signal. As mentioned above for the filter 30, the filter 42 is a low pass filter (LPF) for frequency downconversion and a high pass filter (HPF) for frequency upconversion.

The frequency converted distortion D' on the second path 22 passes through an amplitude and phase adjuster 44 which adjusts the amplitude and phase of the frequency converted distortion D'. The amplitude and phase of the frequency converted distortion D' are adjusted taking the operating parameters of the design components into consideration to reduce the frequency converted distortion D' at the output 16 of the mixer 10, thereby producing the desired frequency converted signal S' as the prominent signal with an acceptable level of intermodulation distortion. Depending on the design parameters, the robustness of the design, and the particular application, different components could be used or components removed from the design.

In this particular embodiment, after being amplitude and phase adjusted, the frequency converted distortion D' then passes through a linear amplifier 46 which is designed to provide additional gain to match the amplitudes of the frequency converted distortions D' on both paths 20 and 22. Generally, the amplitudes of the frequency converted distortions need not exactly match. If the amplitudes of the frequency converted distortions D' are the same, and the distortions D' have a 180 degree phase difference, complete cancellation can be achieved. Such a result is generally not necessary in not only reducing the frequency converted distortion D' at the output 16 but also in reducing the signal S from the second path 22. For example, depending on the application, a phase difference of 175–185 degrees and an amplitude difference of 2 dB between the frequency converted distortions D' can be acceptable.

To equalize the delay of the frequency mixing path 20 with the delay on the second path 22 primarily associated with the amplitude and phase adjuster 44 and the linear amplifier 46, the delay 26 delays the signal S and the signal distortion D on the frequency mixing path 20. The frequency converted distortion D' produced from the linear amplifier 46 is coupled onto the frequency mixing path 20 using a coupler 48. The frequency converted distortion D' from the second path 22 combines with the frequency converted distortion D' on the frequency converted path 20 to produce the desired frequency converted signal S'. In the time domain, the combining of the frequency converted distortions D' at the output 16 of the mixer 10 effectively adds frequency converted energy which was clipped from the signal S by the limiting device 14 back into the frequency mixing path 20 to produce the desired frequency converted signal S'.

In certain embodiments, a coupler 50 at the output 16 obtains and provides a portion of the desired frequency converted signal S' and any remaining distortion D' to control circuitry 52. The control circuitry 52 provides amplitude and phase adjustment signals to the amplitude and phase adjuster 44 to improve removal of the frequency converted distortion D' at the output 16.

In addition to the embodiment described above, alternative configurations of the frequency mixer according to the principles of the present invention are possible which omit and/or add components and/or use variations or portions of the described frequency mixer. The amount of amplitude difference, phase difference and delay difference which is tolerated between combining signals depends on the particular application and the corresponding tolerance permitted by the application. These operating design parameters also can determine which components can be added, changed or omitted. For example, the mixer 10 is described with couplers 32, 34, 35 and 50, but the couplers could be 3 dB summer/splitters, or other devices which can split or combine signals. Alternatively, the splitters 18 and 40 could be implemented by couplers or other devices. Additionally, the delays can be implemented using passive devices, such as a passive filter, transmission line (coax, microstrip, or stripline), or active devices, such as amplifiers, active filters, digital delays or fiber, but active devices do introduce distortion. Furthermore, the locations of the amplitude and phase adjusters and the corresponding delay on the other path can be switched.

As would be understood by one of ordinary skill in the art, the various components making up the frequency mixer and their respective operating parameters and characteristics, such as loss, should be properly matched up to provide the proper operation. The dynamic range as well as other operating parameters for the mixer 12 should be considered with the clipping level and other operating parameters of the limiting device 14. Depending on the parameters chosen for the various components of the mixer arrangement, the dynamic range can be changed. By using multiple mixers to frequency convert portions of an input signal which are then recombined, the frequency mixing system spreads the burden of frequency converting the input signal between the multiple mixers and thereby provides an improved dynamic range when compared to the dynamic range(s) of individual mixers. For example, an input signal with an amplitude that produces a signal outside the dynamic range of one of the mixers could be clipped to produce a signal on the upper boundary of the dynamic range for one mixer. The portion clipped from the input signal could be put on a second path to produce a signal having an amplitude on the upper boundary of the dynamic range of a second mixer on the second path. The frequency converted adjusted signal and the frequency converted portion clipped from the input signal can be recombined at the output of the mixer arrangement to produce a dynamic range for the mixer system which is greater than the dynamic ranges of the individual mixers. Unacceptable levels of intermodulation distortion are not produced because both signals are within the dynamic ranges of the individual mixers. Additionally, a mixer or mixers with lower and/or different dynamic range (s) could be used to provide a desired extended dynamic range at lower cost.

Furthermore, the frequency mixing system is described as receiving an input signal S to be frequency mixed. For discussion purposes, the input signal S is split onto the first path and second paths 20 and 22, and the resulting signals are referred to as S. On the first path 20, the clipped signal is referred to as a composite signal of S and D. On the second path 22, the signal S is combined with the composite signal S with signal distortion D to isolate the signal distortion D on the second path 22. It should be understood that different notations, references and characterizations of the various signals can be used. These designations were chosen for ease of discussion. Additionally, the frequency mixing system has been described using a particular configuration of distinct components, but it should be understood that the frequency converter and portions thereof can be implemented in application specific integrated circuits, software-driven processing circuitry, firmware or other arrangements of discrete components as would be understood by one of ordinary skill in the art with the benefit of this disclosure. Although in the illustrative embodiment is shown with a particular circuitry, the mixer arrangement can use different components which together perform similar functions when compared to the circuitry shown. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of frequency mixing a signal, the method comprising:
   splitting the signal onto a first path and a second path;
   adjusting the amplitude of and mixing the signal on the first path to produce a frequency converted composite signal with signal distortion within the dynamic range of the mixer;
   combining the signal and the signal distortion obtained from the first path with the signal on the second path to leave the signal distortion on the second path;
   mixing said signal distortion on said first path to produce frequency converted distortion on said first path;
   mixing said signal distortion on said second path to produce frequency converted distortion on said second path; and
   combining said frequency converted distortion on said second path with said frequency converted distortion on said first path.

2. The method of claim 1 wherein said steps of mixing further including the step of:
   using a second signal having a certain frequency for said steps of mixing.

3. The method of claim 1, further comprising:
   adjusting a phase of the signal on said first path.

4. The method of claim 1, further comprising:
   equalizing delays created on the first and second paths.

5. The method of claim 1, further comprising:
   adjusting an amplitude and a phase of frequency converted distortion on the second path.

6. A frequency mixer for frequency mixing a signal having an amplitude which would produce a frequency converted signal outside a dynamic range for a mixer, said frequency mixer comprising:
   a splitting device that receives said signal and that splits said signal onto a first path and a second path;
   a gain and phase adjuster to adjust the amplitude and the phase of said signal on the first path to be mixed;
   a limiting device that limits the amplitude of the amplitude and phase adjusted signal to an adjustment level;
   a mixer that receives said signal from said limiting device and that mixes said signal to produce a frequency converted signal within the dynamic range of said mixer; and
   wherein said limiting device and said mixer are on said first path.

7. The apparatus of claim 6 further comprising:
   a coupler on said first path that couples said signal from said limiting device and signal distortion from said limiting device onto a coupling path;
   a second coupler on said second path that combines said signal and said signal distortion on said coupling path with said signal on said second path.

8. The frequency mixer of claim 6, further comprising:
   a phase adjuster to adjust a phase of the signal on the first path.

9. The frequency mixer of claim 6, further comprising:
   an equalizer to equalize delays created on the first and second paths.

10. The frequency mixer of claim 6, further comprising:
    an adjuster to adjust an amplitude and a phase of the frequency converted distortion on the second path.

11. A frequency mixer for frequency mixing a signal, the frequency mixer comprising:
    a splitting device that receives the signal and that splits the signal onto a first path and a second path;
    a gain and phase adjuster to adjust the amplitude and the phase of said signal on the first path to be mixed;
    a limiting device that limits the amplitude of the amplitude and phase adjusted signal to an adjustment level;
    a mixer that receives the signal from the limiting device and that mixes the signal to produce a frequency converted signal within the dynamic range of the mixer;
    a coupler on the first path that couples the signal from the limiting device and signal distortion from the limiting device onto a coupling path;
    a second coupler on the second path that combines the signal and the signal distortion on the coupling path with the signal on the second path; and
    a third coupler that combines the signal distortion on the second path with the signal distortion on the first path;
    wherein the limiting device and said mixer being on said first path.

12. The apparatus of claim 11 wherein said mixer mixes said signal distortion on said first path to produce frequency converted distortion on said first path; and further comprising:
    a second mixer on said second path receives said signal distortion on said second path and mixes said signal distortion to produce frequency converted distortion on said second path; and
    a third coupler receives and combines said frequency converted distortion on said second path and said frequency converted distortion on said first path.

13. A method of frequency converting a signal, said method comprising the steps of:
    splitting said signal onto a first path and a second path
    adjusting the amplitude of said signal on said first path to an adjustment level to generate a signal with signal distortion on said first path;
    obtaining said signal with said signal distortion from said first path to combine said signal and said signal distortion obtained from said first path with said signal on said second path to produce said signal distortion on said second path;
    mixing said signal and said signal distortion on said first path to produce a frequency converted signal and frequency converted distortion on said first path;

mixing said signal distortion on said second path to produce frequency converted distortion on said second path; and combining said frequency converted distortion on said second path with said frequency converted distortion on said first path.

14. A frequency mixer comprising:

a splitting device receives a signal and splits said signal onto a first path and a second path;

a limiting device on said first path limits the amplitude of said signal to an adjustment level and generates said signal with signal distortion;

a coupler on said first path couples said signal and said signal distortion from said limiting device onto a coupling path;

a second coupler on said second path combines said signal and said signal distortion on said coupling path with said signal on said second path to produce said signal distortion on said second path;

a first mixer on said first path receives said signal and said signal distortion from said limiting device and mixes said signal and said signal distortion to produce a frequency converted signal and a frequency mixed distortion;

a second mixer on said second path receives said signal distortion on said second path and mixes said signal distortion to produce frequency converted distortion on said second path; and a third coupler receives and combines said frequency converted distortion on said second path and said frequency converted distortion on said first path.

* * * * *